(12) United States Patent
Neuman

(10) Patent No.: US 10,438,109 B1
(45) Date of Patent: Oct. 8, 2019

(54) TRANSPONDER WIRE BONDED TO ROUND WIRE ON ADHESIVE TAPE HAVING A WATER-SOLUBLE BACKING

(71) Applicant: AUTOMATED ASSEMBLY CORPORATION, Lakeville, MN (US)

(72) Inventor: Robert Neuman, Cannon Falls, MN (US)

(73) Assignee: Automated Assembly Corporation, Lakeville, MN (US)

( * ) Notice: Subject to any disclaimer, the term of this patent is extended or adjusted under 35 U.S.C. 154(b) by 0 days.

(21) Appl. No.: 15/416,628

(22) Filed: Jan. 26, 2017

(51) Int. Cl.
| | |
|---|---|
| G06K 19/077 | (2006.01) |
| G06K 19/07 | (2006.01) |
| H05K 3/30 | (2006.01) |
| H05K 1/18 | (2006.01) |
| H05K 1/09 | (2006.01) |
| H05K 1/03 | (2006.01) |

(52) U.S. Cl.
CPC ... *G06K 19/07773* (2013.01); *G06K 19/0723* (2013.01); *H05K 1/0353* (2013.01); *H05K 1/09* (2013.01); *H05K 1/181* (2013.01); *H05K 3/305* (2013.01); *H05K 2201/0104* (2013.01); *H05K 2201/10098* (2013.01)

(58) Field of Classification Search
USPC .......................................................... 235/492
See application file for complete search history.

(56) References Cited

U.S. PATENT DOCUMENTS

| | | | |
|---|---|---|---|
| 7,629,694 B2 | 12/2009 | Mouttet | |
| 2004/0061660 A1 | 4/2004 | Yoshida et al. | |
| 2005/0093701 A1* | 5/2005 | Hollon | G06K 19/04 340/572.8 |
| 2014/0061314 A1* | 3/2014 | Chan | G06K 19/07779 235/492 |

OTHER PUBLICATIONS

Kellomaki et al., "Toward Washable Wearable Antenna: A Comparison of Coating Materials for Screen-Printed Textile-Based UHF RFID Tags," International Journal of Antennas and Propagation, vol. 2012, Article ID 476570, pp. 11 (2012).
Tsolis et al., "Embroidery and Related Manufacturing Techniques for Wearable Antennas: Challenges and Opportunities," Electronics, 3(2):314-338 (2014).

\* cited by examiner

*Primary Examiner* — Rafferty D Kelly
(74) *Attorney, Agent, or Firm* — Crawford Maunu PLLC

(57) ABSTRACT

A disclosed circuit arrangement includes an adhesive layer on a water soluble backing, antenna wire adhered to the adhesive layer, an RF transponder disposed on the adhesive layer, and first and second cross wires attached to the adhesive layer and disposed proximate the RF transponder. The antenna wire has first and second portions attached at a third portion of the first cross wire and at a fourth portion of the second cross wire. The first and second cross wires and the antenna wire have round cross sections. The first portion and the third portion have flat areas of contact, and the second and fourth portions have flat areas of contact. A first bond wire is connected to the RF transponder and to the first (Continued)

portion of the antenna wire, and a second bond wire is connected to the RF transponder and to the second portion of the antenna wire.

20 Claims, 6 Drawing Sheets

TRANSPONDER WIRE BONDED TO ROUND WIRE ON ADHESIVE TAPE HAVING A WATER-SOLUBLE BACKING

FIELD OF THE INVENTION

The disclosure describes wire bonding an RF transponder to round wiring on adhesive tape having a water-soluble backing.

BACKGROUND

There are a number of applications in which electronics are attached to various articles. The electronics may provide a function that is ancillary to the function of the article or may work in conjunction with the article to provide a desired function. Radio frequency identification (RFID) and near-field communication are examples of such applications.

RFID applications vary from inventory control to traffic management to pet identification. RFID systems generally include readers and tags. RFID tags are affixed to the articles to be tracked, and the RFID reader emits a signal to activate the RFID tag. The RFID tag may respond by reading data from a memory and emitting a signal with the desired information for the RFID reader. Near-field communication tags are expanding RF applications beyond identification to data gathering applications.

For some applications, RF transponders and associated wiring are attached to a flexible substrate. Prior to mounting the electronic device, wiring patterns may be formed on the substrate using a print-and-etch process to construct the antenna.

Making RF transponder arrangements on a flexible substrate may be prohibitively expensive for some applications. The expense is attributable in part to the print-and-etch processes used in creating the wiring pattern. Expensive chemicals are required for print-and-etch processes, and hazardous waste is a byproduct.

SUMMARY

A transponder arrangement is provided in one implementation. The transponder arrangement includes a water soluble backing and an adhesive layer disposed on one surface of the water soluble backing. An antenna wire is adhered directly to the adhesive layer, and a radio frequency (RF) transponder is disposed on the adhesive layer and coupled to the antenna wire. First and second cross wires are attached to the adhesive layer and are disposed proximate the RF transponder. The antenna wire includes first and second portions attached at a third portion of the first cross wire and at a fourth portion of the second cross wire, respectively. The first and second cross wires and the antenna wire are round wires having round cross sections, the first portion and the third portion have flat areas of contact, and the second and fourth portions have flat areas of contact. A first bond wire is connected to the RF transponder and to the first portion of the antenna wire, and a second bond wire is connected to the RF transponder and to the second portion of the antenna wire.

A method of making a transponder arrangement is provided in another implementation. The method includes attaching first and second cross wires to an adhesive layer that is disposed on a water soluble backing. The first and second cross wires have round cross sections. The method further includes attaching antenna wire to the adhesive layer. The antenna wire has a round cross section and first and second portions that intersect the first and second cross wires, respectively. The first and second portions of the antenna wire and portions of the cross wires are compressed at intersections with the first and second portions of the antenna wire. The method further includes attaching a radio frequency (RF) transponder to the adhesive layer proximate the first and second cross wires and wire bonding compressed portions of the first and second portions of the antenna wire and portions of the cross wires to the RF transponder.

The above summary is not intended to describe each disclosed embodiment. The figures and detailed description that follow provide additional example embodiments.

BRIEF DESCRIPTION OF THE DRAWINGS

Other aspects and advantages will become apparent upon review of the Detailed Description and upon reference to the drawings in which.

DETAILED DESCRIPTION

Figure 1:
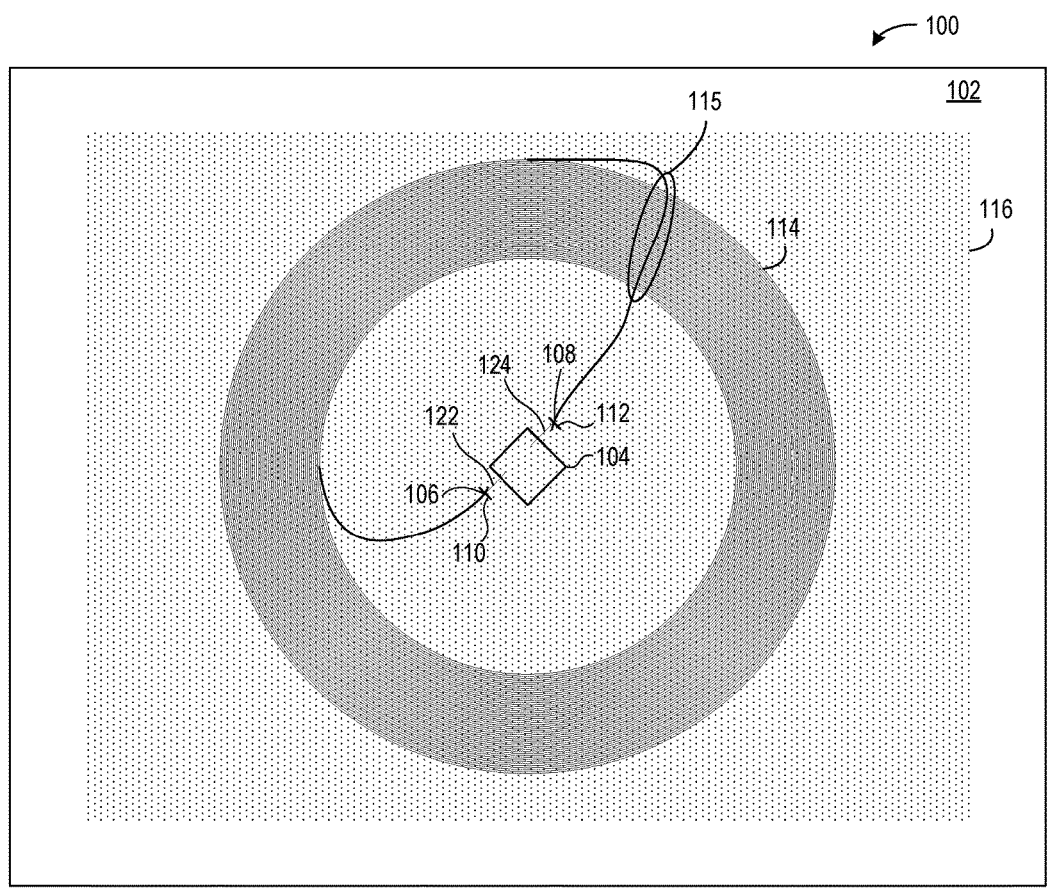
FIG. 1 shows an example of an RF transponder arrangement.

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element. Terms such as over, under, top, bottom, above, below, may be used herein to refer to relative positions of elements as shown in the figures. It should be understood that the terminology is used for notational convenience only and that in actual use the disclosed structures may be oriented different from the orientation shown in the figures. Thus, the terms should not be construed in a limiting manner.

The disclosed structures and methods provide minimally obtrusive RF transponder arrangements that can be constructed using fewer environmentally hazardous chemicals than in prior approaches. The disclosed approaches use round wire rather than printed-and-etched patterns of conductive material for wiring the RF transponder arrangements. "Wire" as used herein does not refer to printed or printed-and-etched patterns of conductive material. Rather, as used herein, wire refers to one or more strands of conductive material that have been made, for example, by drawing the conductive material through draw plates. Using a fine gauge copper wire eliminates the use of environmentally hazardous chemicals as would be required for printing and etching. However, additional challenges are presented in connecting the wire to electronic devices such as RF transponders.

Automated wire bonding machines may be used to construct wire bonds between the antenna and the RF transponder. With fine gauge wire as the antenna, the wire bonding machine may have difficulty locating the desired portions of the wiring. Distinguishing a strand of the fine gauge wire from the adhesive that binds the antenna wire to the substrate based on imagery gathered by the wire bonding machine may be problematic. In addition, even if the wire bonding machine is properly positioned, making a durable wire bond on the fine gauge wire presents problems. The fine gauge and rounded surface of the wire make an unstable bonding surface and are not conducive to making a strong joint between the wire and bond wire. The disclosed approaches produce a structurally sound wire bond from the antenna to the RF transponder.

In addition to providing environmentally friendly wiring and strong wire bonds, the disclosed RF transponder arrangements are flexible and minimally obtrusive, making the arrangements suitable for a variety of applications. The disclosed RF transponder arrangements include a water-soluble backing for an adhesive layer, with the RF transponder and antenna wire attached to the adhesive layer. The resulting structure can withstand millions of flexes and has a thin profile.

In one implementation, a transponder arrangement includes a water soluble backing having an adhesive layer, and an antenna and RF transponder disposed on the adhesive layer. Cross wires are also attached to the adhesive layer and disposed proximate the RF transponder, such that the RF transponder may be wire bonded at the cross wires. A first portion of antenna intersects one of the cross wires, and a second portion of the antenna intersects another one of the cross wires. The antenna and cross wires are round wires, but have flat areas of contact formed at the intersections between the cross wires and the one or more wire segments. Bond wires connect the RF transponder to the joints at the intersections between the cross wires and the portions of the antenna.

In a method of making a circuit arrangement, first and second round cross wires along with antenna wire are attached to an adhesive layer on a water soluble backing. The first and second cross wires intersect the antenna wire. The portions of the antenna wire and portions of the cross wires at the intersections are compressed, forming flat contact areas. The compressed joints at the intersections of the cross wires and portions of the antenna wire provide stable areas for welding and wire bonding. In addition, the intersections may be readily detected by camera-guided welding and wire bonding machines. An RF transponder is attached to the adhesive layer proximate the first and second cross wires and wire bonded to the flat contact areas of the first and second portions of the antenna wire.

FIG. 1 shows an example of an RF transponder arrangement 100. The RF transponder arrangement generally includes a water soluble backing 102 having an adhesive layer 116, an RF transponder 104, and coil antenna wire 114. The particular functions of the RF transponder are application dependent. Example applications include RFID and near-field communications. In general, the transponder modulates and demodulates an RF signal and processes information according to the application. The RF transponder may be packaged or unpackaged (a "bare die") according to application requirements. The water soluble backing can be poly vinyl alcohol or other application-suitable water soluble backing.

Rather than using expensive print-and-etch techniques to make antenna wiring for the RF transponder, the antenna wire is attached to a layer of adhesive layer on a water soluble backing. The wire may be bare wire or wire encased in a dielectric jacket. The wire may be made of any material suitable for the application. The antenna wire 114 may be a fine gauge, round (round cross-section), bare wire. For example, 44 gauge (AWG) copper or silver-coated copper wire has been found to be suitable for some applications. However, different gauges may be suitable for different applications. For an implementation having bare antenna wire, an insulating bridge (not shown) may be disposed between intersecting portions 115 of the antenna wire.

The adhesive layer 116 can be a pressure sensitive adhesive, which keeps the wire in place as the antenna pattern is formed. It will be appreciated that other types of adhesives may be suitable for different applications. The RF transponder 104 may be attached to the substrate 102 using the same adhesive as is used for the antenna wire.

Cross wires 110 and 112 are attached to the adhesive layer 116 and located proximate the RF transponder 104, in particular, at a distance suitable for wire bonding of the RF transponder to the end portions of the antenna wire. The cross wires may be segments of round copper, silver-coated copper, aluminum, or stainless steel wire, bare or jacketed, of the same diameter or larger diameter than the antenna wire. Antenna wire 114, which is a single coiled wire segment in the example, has portions for connecting to bond wires 122 and 124. In the coil antenna pattern, connections to the RF transponder are made at end portions 106 and 108 of the antenna wire. For other antenna patterns, the connection to the RF transponder may be at portions between the end portions of the antenna wire (e.g., FIG. 5). End portions 106 and 108 of the antenna wire intersect the cross wires, and the wires at the intersections are compressed together to form a flat contact area for wire bonding the antenna to the RF transponder.

Figure 2:
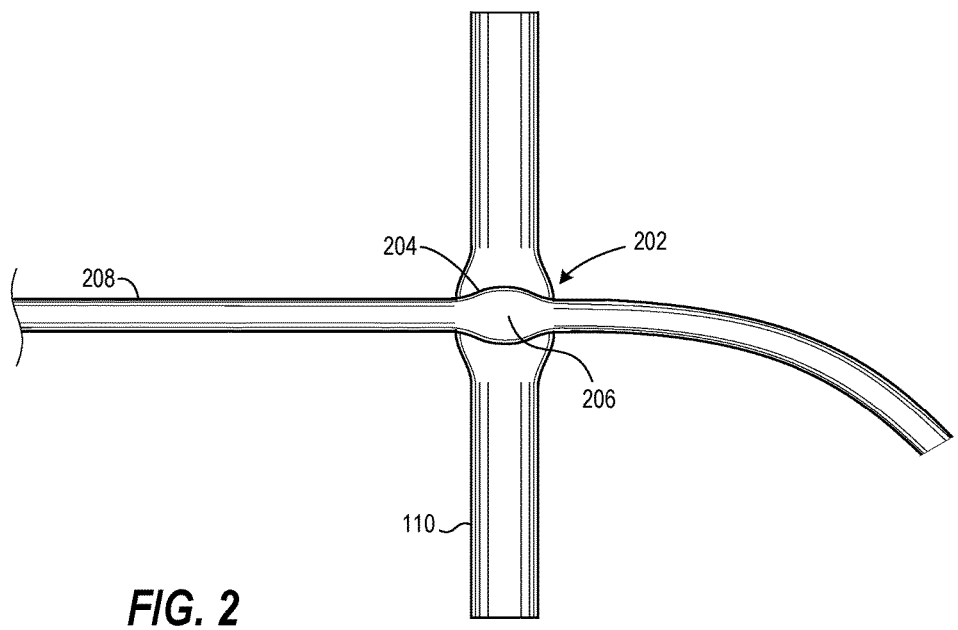
FIG. 2 shows a plan view of the intersection between a cross wire and a portion of round wire.

FIG. 2 shows a plan view of the intersection 202 between a cross wire 110 and a portion 204 of round wire 208. The portion 204 of the round wire may correspond to either of portions 106 and 108 of the antenna wire of FIG. 1. In alternative applications, the portion 204 may correspond to a portion of the antenna wire of FIG. 5.

The cross wire 110 and wire 208 are compressed at the intersection 202, forming a flat contact area 206 for wire bonding. In addition to forming a contact area for wire bonding, compression of the intersection mechanically interlocks the cross wire 110 and portion 204 at the intersection, thereby stabilizing the joint for welding. The intersection further provides a marker for camera-guided welding and wire bonding equipment.

Figure 3:
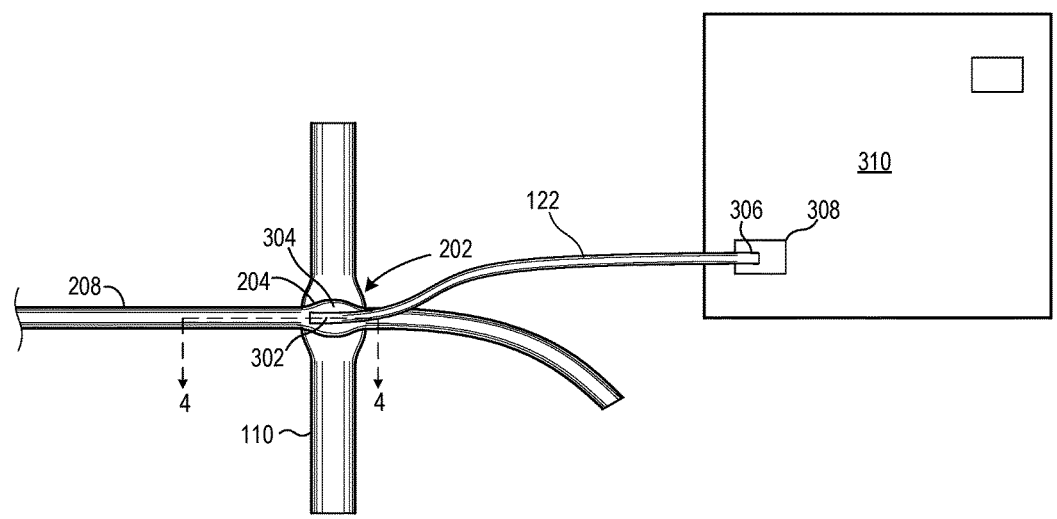
FIG. 3 shows a plan view of the cross wire and a portion of round wire, along with an electronic device and bond wire connecting the electronic device to the wire at the cross wire joint.

FIG. 3 shows a plan view of the cross wire 110 and a portion 204 of round wire 208, along with an electronic device 310 and bond wire 122 connecting the electronic device to the wire 208 at the cross wire joint. Once the cross wire 110 and portion 204 have been welded at the intersection 202, the bond wire 122 may be attached to the flat contact area at the resulting joint.

One end 302 of the bond wire 122 is bonded to flat contact area 304, and the other end of the bond wire 306 is bonded to the contact pad 308 on the electronic device 310. The bond wire may be wedge bonded to the RF transponder and antenna wire to provide a low profile. In other applications, the bond wires may be ball bonded. In an example implementation, the cross wire 110 and wire 208 may be copper, silver coated copper, aluminum, or stainless steel wire, and the bond wire may be either gold or aluminum.

Figure 4:
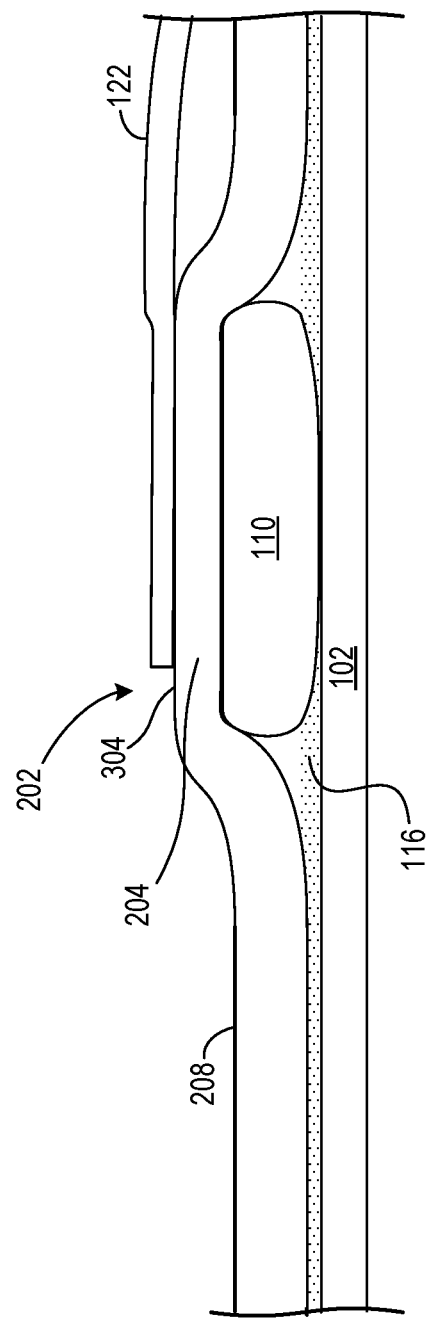
FIG. 4 shows a cross sectional view, taken in the direction of arrow 4 in FIG. 3, of the joint at which the cross wire, wire, and bond wire are connected.

FIG. 4 shows a cross sectional view, taken in the direction of arrow 4 in FIG. 3, of the joint at which the cross wire 110, wire 208, and bond wire 122 are connected. The view shows the flat contact area 304 and the interlocking of the cross wire 110 and the portion 204 of the wire 208 formed as a result of compressing the joint 202. The cross wire 110 and portion 204 of the wire 208 are not round at the compressed joint, as shown by the cross section of the cross wire 110. After the cross wire and the wire segment have been welded at the joint, the bond wire 122 may be attached to the flat contact area 304 such as by wedge bonding or ball bonding.

In one embodiment, the cross wire 110, wire 208, and bond wire 122 may be of different sizes. For example, the cross wire may be of a larger gauge than the wire segment, and the wire segment may be of a larger gauge than the bond wire. In other implementations, the cross wire and wire segment may be of the same gauge, and the bond wire of a smaller gauge.

Figure 5:
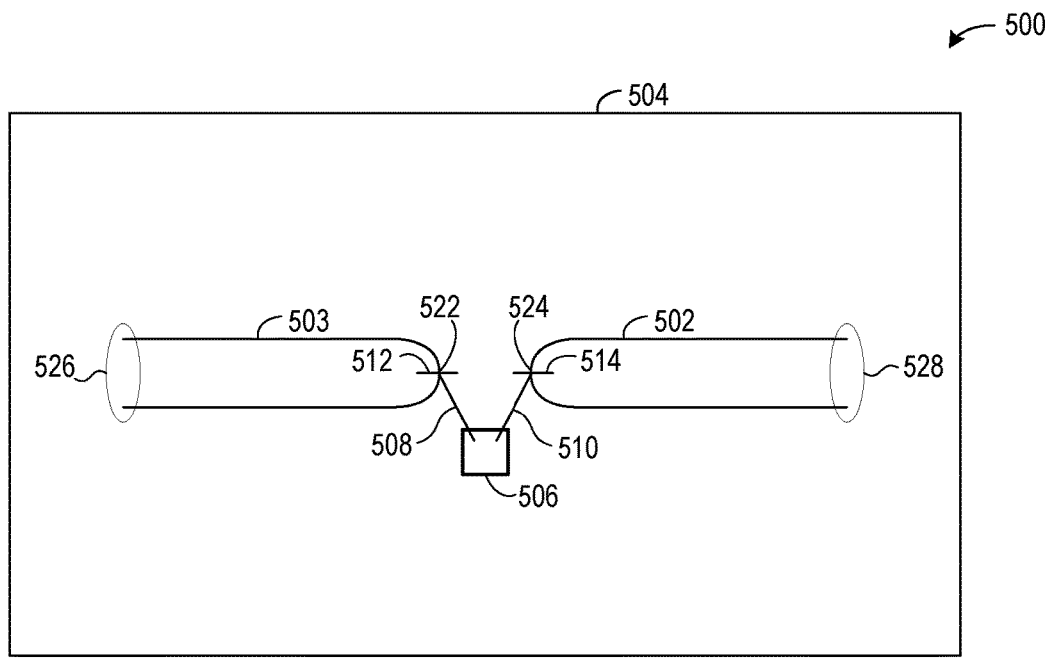
FIG. 5 shows an alternative antenna pattern and the connection of the antenna wires to the cross wires.

FIG. 5 shows an alternative antenna pattern and the connection of the antenna wires to the cross wires. The antenna pattern includes wire segments 502 and 503 and having the wire bonds at portions of the antenna wire that are between end portions of the antenna wire. It will be appreciated that in addition to the antenna patterns of FIGS. 1 and 5, the disclosed structures are adaptable for any of the many different antenna patterns known in the art to be suitable for RF transponder applications. As with the RF transponder arrangement 100 of FIG. 1, RF transponder arrangement 500 includes a substrate 504 and an RF transponder 506. The antenna and RF transponder directly attached to the adhesive layer as described for the RF transponder arrangement 100.

Cross wires 512 and 514 are attached to the substrate 504 and located proximate the RF transponder 506. The wire segments 502 and 503 intersect the cross wires 512 and 514, respectively, and the intersections are at portions 522 and 524 of the wire segments that are between the end portions 526 and 528. The wires at the intersections are compressed as described above. The bond wires 508 and 510 connect the RF transponder 506 to flat contact areas (e.g., FIGS. 2, 3) at portions 522 and 524 of the wire segments 502 and 503. The type of wire used for the wire segments 502 and 503 may be the same as the type of wire used for the antenna wire 114 of FIG. 1.

Figure 6:
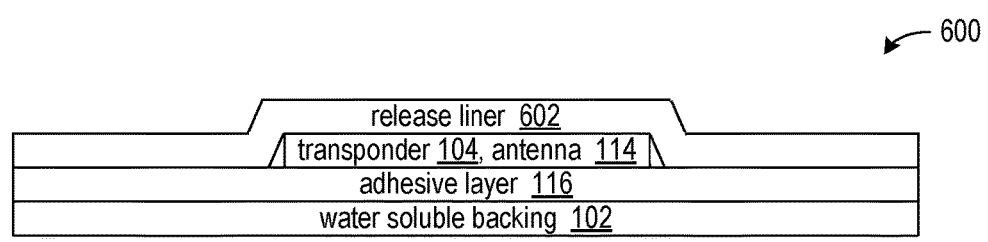
FIG. 6 shows a cross sectional view of an RF transponder arrangement according to another implementation.

FIG. 6 shows a cross sectional view of an RF transponder arrangement 600 according to another implementation. The RF transponder arrangement 600 includes a water soluble backing 102, adhesive layer 116, RF transponder 104 and antenna 114 as described above in FIGS. 1-5. The RF transponder arrangement further includes a release liner 602 that is attached to the adhesive layer. One surface of the adhesive layer is attached to the water soluble backing, and the opposing surface of the adhesive layer is covered by the release liner. The release liner is separable from the adhesive layer such as by peeling the release liner away from the adhesive layer. The release liner provides a temporary barrier over the adhesive layer in order to protect the adhesive layer from dust and dirt and prevent attachment of the RF transponder to articles other than those intended.

Figure 7:
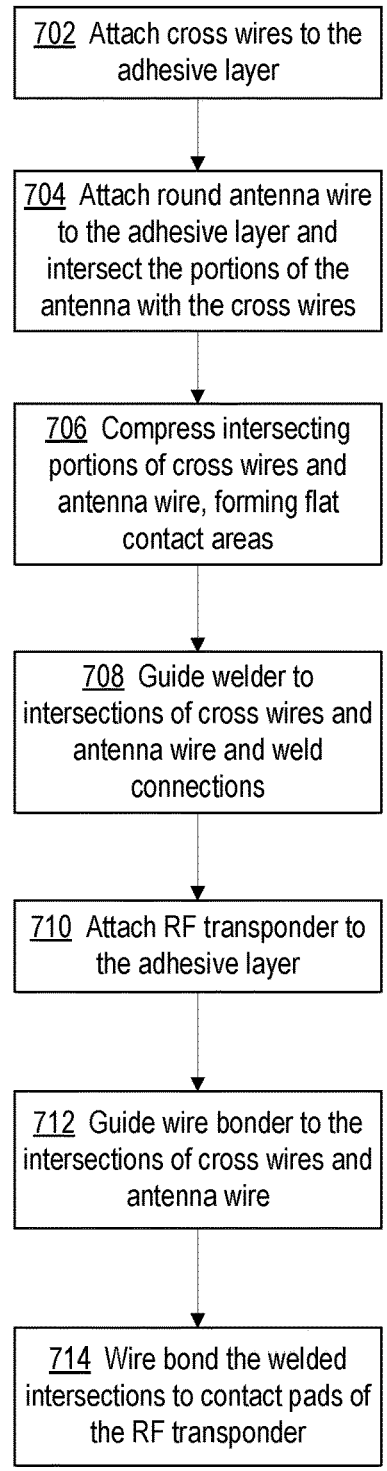
FIG. 7 is a flowchart of a process of making an RF transponder arrangement having an RF transponder wire bonded to joints formed at the intersections of cross wires and portions of antenna wire.

FIG. 7 is a flowchart of a process of making an RF transponder arrangement having an RF transponder wire bonded to joints formed at the intersections of cross wires and portions of antenna wire. Cross wires are attached to the adhesive layer on a water soluble backing at block 702. The adhesive layer can be a pressure-sensitive adhesive, and the cross wires can be located near the position that is or will be occupied by the RF transponder. The water soluble backing, adhesive, and cross wires may be as described above.

At block 704, round antenna wire is attached to the adhesive layer, and portions of the antenna wire intersect the cross wires, respectively. The type of antenna wire may be as described above in regards to the RF transponder arrangement 100.

At block 706, the intersecting portions of the antenna wire and the cross wires are compressed to interlock the intersecting portions and form flat contact areas at the intersections. In an example approach, the joints may be compressed by robotic action. A robot may have an image sensor and processor for identifying intersections. Based on the imagery, a head unit may be positioned above a joint to be compressed. The head unit may include a pneumatically actuated piston having a cross section that is approximately the size of the joint to be compressed. Once in position and at the desired height, the piston is driven by pneumatic force in a hammer action at the joint. The striking of the piston against the joint interlocks the portions of the wires at the intersection and forms a flat contact area for wire bonding.

At block 708, the compressed joints are welded. In one approach, the joints may be welded using an ultrasonic welder that is guided to the joints by digital imagery and robotic control.

At block 710, the RF transponder is placed near the cross wires and attached to the adhesive layer. The RF transponder can be attached before or after the cross wires and wire segments are attached to the adhesive layer, depending on implementation requirements.

The wire bonding head of a wire bonder is guided to the flat contact areas at block 712. The wire bonder may be imagery-based, using images of the wiring to position the wire bonding head at the intersections of the cross wires and wire segments on the substrate. At block 714, the joints formed at the intersections of the cross wires and wire segments are wire bonded to contact pads on the electronic device. The bond wires may be wedge bonded or ball bonded, depending on application requirements. In implementations in which insulated wire is used, the welding and wedge bonding at the intersections of the cross wires and antenna wire effectively removes the dielectric material at the joints. Though blocks 702-714 are presented in a particular order, it will be recognized that the order of processing may vary according to implementation requirements.

Figure 8:
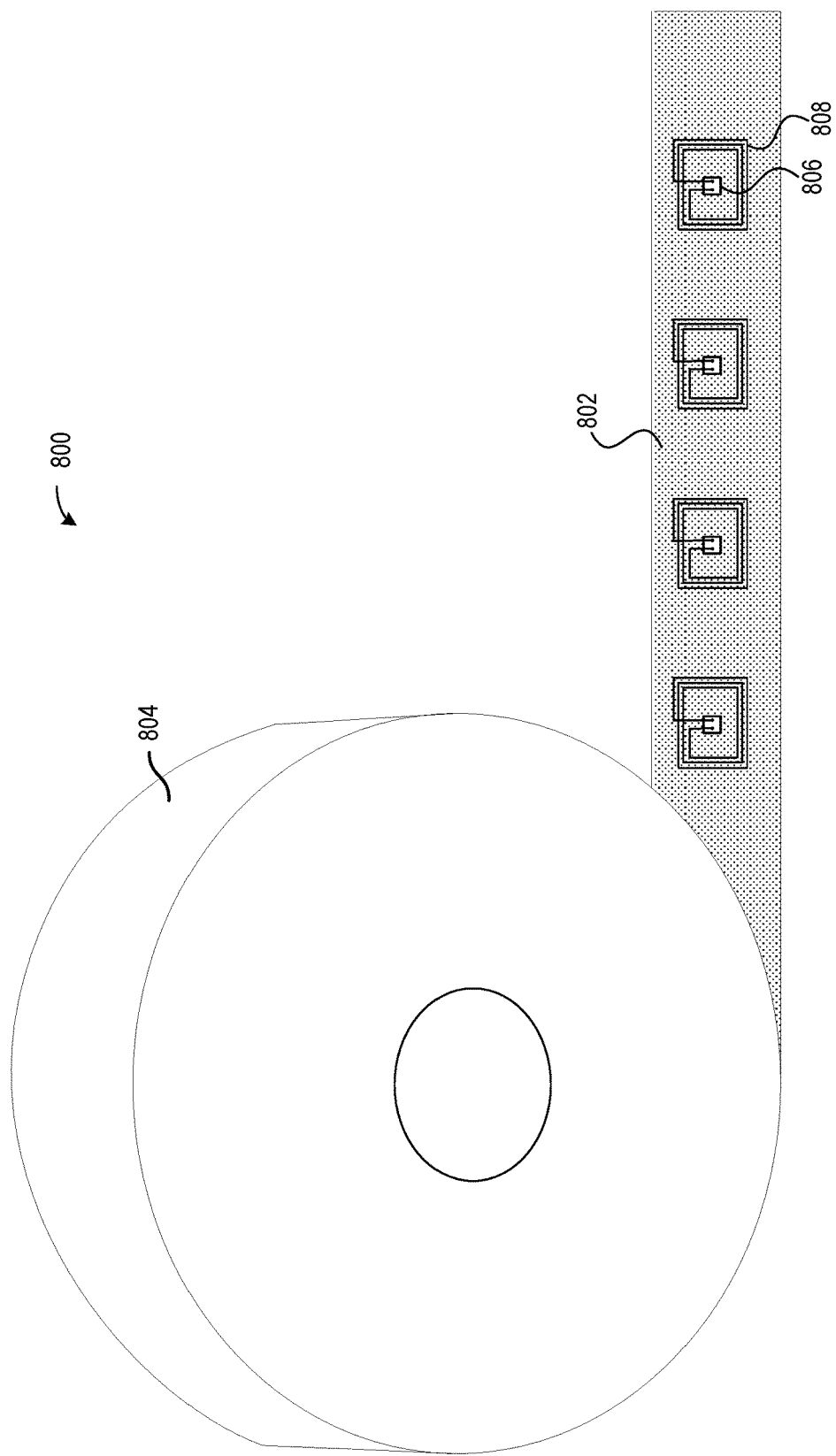
FIG. 8 shows a roll of RF transponder arrangements according to another implementation.

FIG. 8 shows a roll of RF transponder arrangements according to another implementation. The roll 800 includes multiple RF transponder arrangements adhered to the adhesive layer 802 on a water soluble backing 804. Though not shown, a release liner, such as the release liner 602 shown in FIG. 6, can be disposed over the adhesive layer to prevent the adhesive layer from adhering to the surface of the water soluble backing opposite the surface having the adhesive layer when in the rolled form. Each transponder arrangement includes an antenna and an RF transponder. For example, one of the transponder arrangements includes RF transponder 806 and antenna 808. In each transponder arrangement, the antenna 808 is adhered directly to the adhesive layer 802. The RF transponder 806 may either be directly adhered to the adhesive layer or mounted on a strap (not shown), which is directly adhered to the adhesive layer. In combination with roll-to-roll manufacturing processes for constructing the roll 800, the water soluble backing adhesive layer, RF transponder, and antenna can be constructed and implemented as shown and described in FIGS. 1-7.

The present invention is thought to be applicable to a variety of applications. Other aspects and embodiments will be apparent to those skilled in the art from consideration of the specification and practice of the circuits and methods disclosed herein. It is intended that the specification and illustrated embodiments be considered as examples only, with a true scope of the invention being indicated by the following claims.

What is claimed is:

1. A transponder arrangement, comprising:
   a water soluble backing;
   an adhesive layer disposed on one surface of the water soluble backing;
   antenna wire adhered directly to the adhesive layer;
   a radio frequency (RF) transponder disposed on the adhesive layer and coupled to the antenna wire;
   first and second cross wires attached to a same surface of the adhesive layer and disposed proximate the RF transponder;
   wherein the antenna wire includes first and second portions attached at a third portion of the first cross wire and at a fourth portion of the second cross wire, respectively;
   wherein the first and second cross wires and the antenna wire are round wires having round cross sections, the first portion and the third portion have flat areas of contact, and the second and fourth portions have flat areas of contact;
   a first bond wire connected to the RF transponder and to the first portion of the antenna wire; and
   a second bond wire connected to the RF transponder and to the second portion of the antenna wire.

2. The transponder arrangement of claim 1, wherein the RF transponder is adhered directly to the adhesive layer.

3. The transponder arrangement of claim 1, wherein the adhesive layer is a pressure-sensitive adhesive.

4. The transponder arrangement of claim 1, wherein the antenna wire is comprised of bare wire adhered directly to the adhesive layer.

5. The transponder arrangement of claim 1, wherein the antenna wire is comprised of insulated wire adhered directly to the adhesive layer.

6. The transponder arrangement of claim 1, wherein the first bond wire is attached at the first portion of the antenna wire, and the second bond wire is attached at the second portion of the antenna wire.

7. The transponder arrangement of claim 1, wherein the first and second cross wires are larger gauge than the antenna wire, and the antenna wire is a larger gauge than the first and second bond wires.

8. The transponder arrangement of claim 1, wherein the first and second portions are end portions of the antenna wire.

9. The transponder arrangement of claim 1, wherein the antenna wire includes first and second wire segments, and the first portion of the antenna wire is between end portions of the first wire segment, and the second portion of the antenna wire is between end portions of the second wire segment.

10. The transponder arrangement of claim 1, wherein the first and second cross wires are one of copper, silver-coated copper, aluminum, or stainless steel.

11. The transponder arrangement of claim 1, wherein the water soluble backing includes poly vinyl alcohol.

12. The transponder arrangement of claim 1, further comprising a release liner attached to the adhesive layer.

13. A method of making a circuit arrangement, comprising:
   attaching first and second cross wires to a same surface of an adhesive layer that is disposed on a water soluble backing, the first and second cross wires having round cross sections;
   attaching antenna wire to the adhesive layer, the antenna wire having a round cross section and first and second portions that intersect the first and second cross wires, respectively;
   compressing the first and second portions of the antenna wire and portions of the cross wires at intersections with the first and second portions of the antenna wire;
   attaching a radio frequency (RF) transponder to the adhesive layer proximate the first and second cross wires; and
   wire bonding compressed portions of the first and second portions of the antenna wire and portions of the cross wires to the RF transponder.

14. The method of claim 13, wherein the wire bonding includes attaching a first bond wire at the first portion of the antenna wire, and attaching a second bond wire at the second portion of the antenna wire.

15. The method of claim 14, wherein the first and second cross wires are larger gauge than the antenna wire, and the antenna wire is a larger gauge than the first and second bond wires.

16. The method of claim 13, wherein the first and second portions of the antenna wire are end portions of the antenna wire.

17. The method of claim 13, wherein the antenna wire includes a first wire segment and a second wire segment, the first portion of the antenna wire is between end portions of the first wire segment, and the second portion of the antenna wire is between end portions of the second wire segment.

18. The method of claim 13, wherein the first and second cross wires are one of copper, silver-coated copper, aluminum, or stainless steel.

19. The method of claim 13, wherein the adhesive layer is a pressure sensitive adhesive.

20. The method of claim 13, wherein the water soluble backing includes poly vinyl alcohol.

* * * * *